United States Patent
Schreier

(10) Patent No.: US 6,737,999 B2
(45) Date of Patent: May 18, 2004

(54) MISMATCH-SHAPING FOR A QUADRATURE DIGITAL-TO-ANALOG CONVERTER

(75) Inventor: Richard Schreier, North Andover, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/234,037

(22) Filed: Sep. 3, 2002

(65) Prior Publication Data

US 2004/0041719 A1 Mar. 4, 2004

(51) Int. Cl.⁷ .............................................. H03M 1/06
(52) U.S. Cl. ...................... 341/118; 341/141; 341/144; 341/106
(58) Field of Search ................. 341/118, 141, 341/131, 145, 153, 143, 144, 156, 163

(56) References Cited

U.S. PATENT DOCUMENTS

| 4,050,017 | A | * | 9/1977 | Paufve ....................... 324/72.5 |
| 5,103,453 | A | * | 4/1992 | Kebabian et al. ............. 372/20 |
| 5,784,419 | A | * | 7/1998 | LaRosa et al. ............... 375/350 |
| 6,031,474 | A | * | 2/2000 | Kay et al. .................... 341/106 |
| 6,154,158 | A | * | 11/2000 | Walker ........................ 341/118 |
| 6,278,391 | B1 | * | 8/2001 | Walker ........................ 341/118 |
| 6,621,437 | B2 | * | 9/2003 | Khalil et al. ................. 341/141 |

* cited by examiner

Primary Examiner—Michael Tokar
Assistant Examiner—Lam T. Mai
(74) Attorney, Agent, or Firm—Bromberg & Sunstein LLP

(57) ABSTRACT

Mismatch-shaping for a digital-to-analog converter (DAC) involves allocating elements from an element array to multiple DAC channels. Various state variables are used to keep track of element usage, and the number of state variables is preferably less than the number of elements in the element array. The element array may be treated like a bi-directional circular array, in which case the array elements may be allocated to the two DAC channels as needed in opposite directions with reference to a common anchor point such that the array elements for each channel are contiguous within the circular array. All array elements are available for allocation to both DAC channels, although no array element can be allocated to both DAC channels simultaneously. A collision resolution scheme is used to prevent overlapping allocations of array elements. Pointers may be used to keep track of the array elements allocated to each channel, making implementation relatively simple.

21 Claims, 13 Drawing Sheets

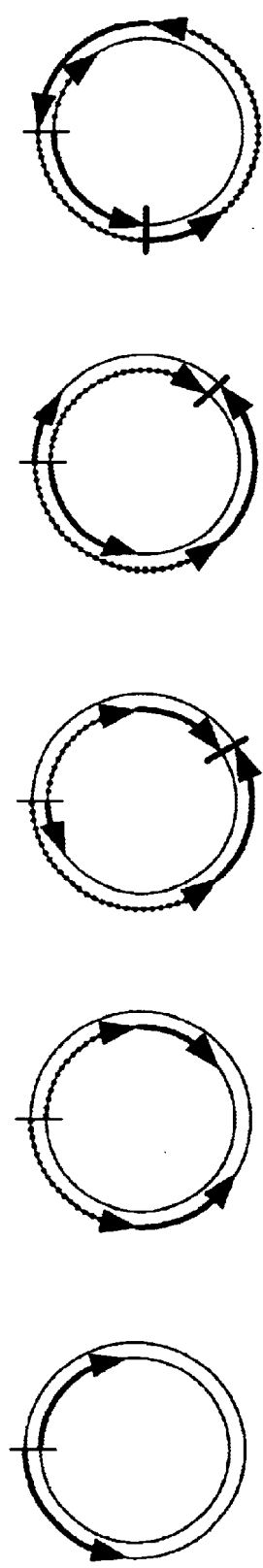
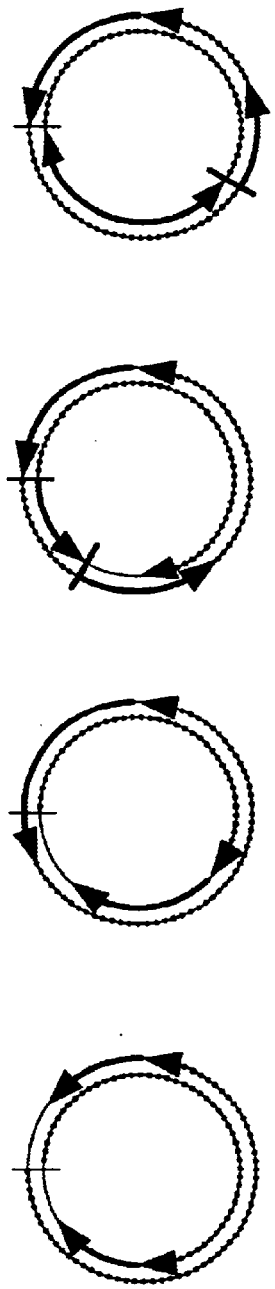
FIG. 8A  FIG. 8B  FIG. 8C  FIG. 8D  FIG. 8E
FIG. 8F  FIG. 8G  FIG. 8H  FIG. 8I

US 6,737,999 B2

MISMATCH-SHAPING FOR A QUADRATURE DIGITAL-TO-ANALOG CONVERTER

FIELD OF THE INVENTION

The present invention relates generally to digital-to-analog converters, and more particularly to mismatch-shaping for multi-bit digital-to-analog converters.

BACKGROUND OF THE INVENTION

A digital-to-analog converter (DAC) outputs analog signals based upon corresponding digital input signals. Two DACs can be used together to form a quadrature DAC. In order to prevent image signals and image noise from corrupting the frequency band in which the quadrature DAC operates, the two component DACs should match closely.

Quadrature DACs are often used in communication systems for converting between low frequency (baseband) signals and high frequency carriers. Specifically, modern communication systems often use high-frequency signals to carry a multitude of signals over a single communication channel. However, both the transmitter and the receiver in such a system typically use low-frequency signal processing to perform the requisite channel filtering and modulation/demodulation. Therefore, the transmitter and receiver typically need to translate between low frequency (baseband) signals and high frequency carriers. For convenience, translation of a high frequency carrier to a low frequency (baseband) signal is often referred to as "downconversion," while translation of a low frequency (baseband) signal to a high frequency carrier is often referred to as "upconversion."

Upconversion and downconversion typically require an analog mixer, which can be either a single (real or scalar) mixer or a dual (quadrature or vector) mixer. The quadrature DAC provides quadrature analog signals (referred to as "I" and "Q") to the analog mixer. In the context of a downconversion operation, a scalar mixer must be preceded by a filter, which attenuates undesired signals that would otherwise mix to the desired intermediate frequency (IF), while in an upconversion operation, the output of the mixer must be filtered to eliminate undesired upconversion products. These analog image filters must possess a large amount of attenuation, an attribute that is difficult to achieve at high frequencies. An ideal vector mixer eliminates the need for an image filter by essentially cancelling the image. In practice, this cancellation is imperfect, so a vector mixer's main advantage is that it simplifies the image filter. Maximizing the degree of cancellation is desirable because it minimizes the power, complexity, and cost of the image filter. Since a monolithic quadrature mixer can have an image rejection ratio (IRR) of approximately 60 dB, the quadrature balance of the mixer's analog inputs (and hence the quadrature DAC outputs) should be 70 dB or more in order to prevent significant degradation in system performance.

In order for the I and Q signals to have good balance, the full-scales of the two DACs must match very precisely. An imbalance of only 0.1% is sufficient to limit IRR to less than 60 dB. This mismatch problem is akin to the mismatch problem that plagues multi-bit DACs used in multi-bit delta-sigma ($\Delta\Sigma$) modulators.

The DAC in a multi-bit delta-sigma modulator typically uses an array of unit elements (e.g., resistors, capacitors, current sources) to generate its analog output signals. Variations among the unit elements can cause nonlinearity in the DAC. Therefore, mismatch-shaping is often used in a multi-bit DAC to shape the errors caused by element mismatch in multi-bit modulators.

Mismatch-shaping typically involves a dynamic selection of elements from the element array in the formation of each output sample. In low-frequency DACs, mismatch-shaping essentially ensures that all elements are used equally often, so that errors among the elements average out over time.

The following documents are referenced throughout the specification using the corresponding reference number in brackets, and are hereby incorporated herein by reference in their entireties:

[1] S. A. Jantzi, K. W. Martin and A. S. Sedra, "Quadrature bandpass $\Delta\Sigma$ modulation for digital radio," *IEEE J. Solid-State Circuits*, vol. 32, no. 12, pp. 1935–1950, December 1997;

[2] R. Schreier and B. Zhang, "Noise-shaped multibit D/A convertor employing unit elements," *Electronics Letters*, vol. 31, no. 20, pp. 1712–1713, Sep. 28, 1995;

[3] R. Schreier, "Mismatch-shaping digital-to-analog conversion," 103rd *Convention of the Audio Engineering Society*, preprint no. 4529, Sep. 26–29, 1997;

[4] T. Shui, R. Schreier and F. Hudson, "Mismatch-shaping for a current-mode multi-bit delta-sigma DAC," *IEEE J. Solid-State Circuits*, vol. SC-34, no. 3, pp. 331–338, March 1999;

[5] H. S. Jackson, "Circuit and method for cancelling nonlinearity error associated with component value mismatches in a data converter," U.S. Pat. No. 5,221,926, Jun. 22, 1993;

[6] R. W. Adams and T. W. Kwan, "Data-directed scrambler for multi-bit noise-shaping D/A converters," U.S. Pat. No. 5,404,142, Apr. 4, 1995; and

[7] L. E. Franks and I. W. Sandberg, "An alternative approach to the realization of network functions: The N-path filter," Bell System Technical Journal, 1960, pp. 1321–1350.

SUMMARY OF THE INVENTION

In accordance with one aspect of the invention, mismatch-shaping for a multi-bit digital-to-analog converter (DAC) involves allocating elements from an element array to multiple DAC channels. Various state variables are used to keep track of element usage, and the number of state variables is preferably less than the number of elements in the element array. The element array may be treated like a bi-directional circular array, in which case the array elements may be allocated to the two DAC channels as needed in opposite directions with reference to a common anchor point such that the array elements for each channel are contiguous within the circular array. All array elements are available for allocation to both DAC channels, although no array element can be allocated to both DAC channels simultaneously. A collision resolution scheme is used to prevent overlapping allocations of array elements. In one embodiment of the invention, pointers are used to keep track of the array elements allocated to each channel, making implementation relatively simple.

In accordance with another aspect of the invention, a technique for mismatch-shaping for a quadrature digital-to-analog converter (DAC) involves allocating elements of an element array to two DAC channels. The element array is manipulated as a bi-directional circular array, and elements are allocated to the two DAC channels in opposite directions through the bi-directional circular array starting at a common anchor point. Allocating elements of the bi-directional circular array to the two DAC channels in opposite directions through the bi-directional circular array starting at a common anchor point may involve determining a desired allocation for each of the two DAC channels, and may also involve allocating a first desired number of elements to one of the two DAC channels in one direction through the bi-directional circular array starting at the common anchor point and allocating a second desired number of elements to the other of the two DAC channels in the opposite direction through the bi-directional circular array starting at the common anchor point. Additional elements may be allocated to one of the two DAC channels, said additional elements allocated contiguously and in the same direction as elements previously allocated to the DAC channel. Allocating elements of the bi-directional circular array to the two DAC channels in opposite directions through the bi-directional circular array starting at a common anchor point may also involve determining that the desired allocations for the two DAC channels cause contention between the two DAC channels and resolving the contention between the two DAC channels. Resolving the contention between the two DAC channels may involve selecting one of the two DAC channels as a priority channel and providing a preferred allocation to the priority channel. Selecting one of the two DAC channels as a priority channel may involve determining a number of elements allocated to each of the two DAC channels and selecting as the priority channel the DAC channel having the larger number of elements allocated. Providing a preferred allocation to the priority channel may involve allocating at least one element within the desired allocations of the two DAC channels to the priority channel. Resolving the contention between the two DAC channels may involve moving the common anchor point and may also involve reversing the directions for allocating elements to the two DAC channels. Providing a preferred allocation to the priority channel may involve determining that there is a sufficient number of unused array elements for the priority channel, allocating the unused array elements to the priority channel, changing the anchor point, reversing the allocation directions for the two DAC channels, and allocating a desired number of elements to the non-priority channel. Providing a preferred allocation to the priority channel may involve determining that there is an insufficient number of unused elements for the priority channel and that the priority channel will not complete a rotation through the bi-directional circular array if allocated all unused elements, allocating all unused array elements to the priority channel, changing the anchor point, reversing the allocation directions for the two DAC channels, allocating a desired number of elements to the non-priority channel, and allocating an additional number of elements to the priority channel. Providing a preferred allocation to the priority channel may involve determining that there is an insufficient number of unused elements for the priority channel and that the priority channel will complete a rotation through the bi-directional circular array if allocated all unused elements, allocating all unused array elements to the priority channel, changing the anchor point without reversing the allocation directions for the two DAC channels, allocating a desired number of elements to the non-priority channel, and allocating an additional number of elements to the priority channel. Providing a preferred allocation to the priority channel may involve determining that there are no unused elements, determining that at least one DAC channel will complete a rotation through the bi-directional circular array, changing the anchor point without reversing the allocation directions for the two DAC channels, and allocating the desired number of elements to each of the two DAC channels.

Allocating elements to the two DAC channels in opposite directions through the bi-directional circular array starting at a common anchor point may involve maintaining an anchor pointer for indicating the anchor point and maintaining a separate pointer for each of the two DAC channels, each pointer indicating the last of a number of contiguous array elements allocated to its respective DAC channel relative to the anchor point in a particular direction through the bi-directional circular array.

BRIEF DESCRIPTION OF THE DRAWINGS

In the accompanying drawings:

FIGS. 8A–8I show various element allocation situations that can be encountered in an exemplary embodiment of the present invention using a simplified quadrature element selection strategy;

DETAILED DESCRIPTION OF A PREFERRED EMBODIMENT

In an embodiment of the present invention, mismatch-shaping is applied to a multi-bit DAC in order to increase image attenuation and reduce the nonlinearity caused by element mismatch. Specifically, the multi-bit DAC includes an element array (e.g., resistors, capacitors, current sources) that is used to produce the multiple output signals. Elements are allocated to each output dynamically based upon a predetermined selection strategy in such a way that errors in the DAC outputs induced by element mismatch are substantially averaged out over time. The predetermined selection strategy typically allows any array element to be allocated to any output such that no array element is dedicated to a particular DAC output. The predetermined selection strategy preferably avoids maintaining state information for each element and instead preferably keeps implicit track of element usage, for example, using pointers.

In one exemplary embodiment of the present invention, mismatch-shaping is applied to a quadrature DAC. The quadrature DAC includes an element array that is used to produce both the I and Q output signals. The element array is treated like a bi-directional circular array such that there is a predetermined sequence from any given array element through the remaining array elements and back to that array element. The array elements are allocated to the two DAC channels as needed in opposite directions from a common anchor point such that the array elements for each channel are contiguous within the circular array. All array elements are available for allocation to both DAC channels, although no array element can be allocated to both DAC channels simultaneously. A collision resolution scheme is used to prevent overlapping allocations of array elements. Pointers are used to keep track of the array elements allocated to each channel, making implementation relatively simple.

Figure 1:
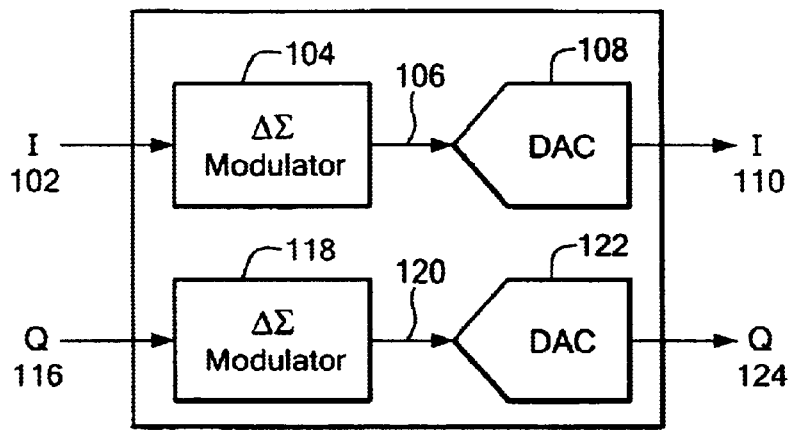
FIG. 1 shows an exemplary system that includes two real $\Delta\Sigma$ modulators and two baseband $\Delta\Sigma$ DACs for forming I and Q signals.

FIG. 1 shows an exemplary system 100 that includes two real ΔΣ modulators 104 and 118 and two baseband ΔΣ DACs 108 and 122 for forming the I and Q signals that would be fed, for example, into an upconversion mixer. An I input signal 102 is fed into the ΔΣ modulator 104, which produces a corresponding digital output signal 106 that is fed into the baseband ΔΣ DAC 108. The baseband ΔΣ DAC 108 produces a corresponding analog I output signal 110. A Q input signal 116 is fed into the ΔΣ modulator 118, which produces a corresponding digital output signal 120 that is fed into the baseband ΔΣ DAC 122. The baseband ΔΣ DAC 122 produces a corresponding analog Q output signal 124.

Within the system 100, each baseband ΔΣ DAC typically has an array of unit elements for forming each output sample. Elements can be allocated from each array using any of a variety of element allocation schemes. One common element allocation scheme is a thermometer-coding scheme in which element allocation begins at the same point in the array each time period. Another element allocation scheme allocates elements in a serial order, using a single pointer to keep track of the next element to be allocated [5]. In any case, because each baseband ΔΣ DAC uses elements from a different array, it is difficult to precisely match the two baseband ΔΣ DACs.

Figure 2:
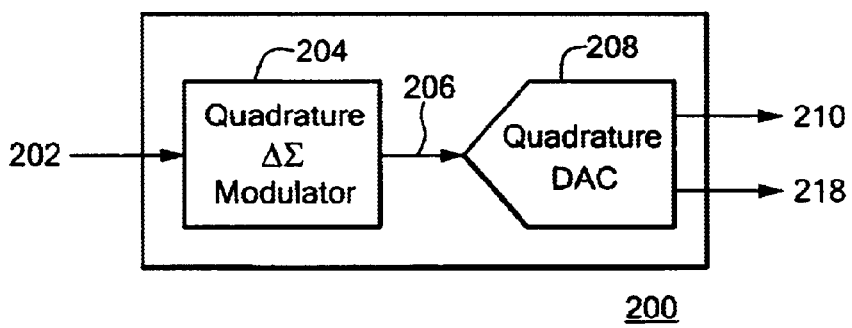
FIG. 2 shows an exemplary system that includes a quadrature $\Delta\Sigma$ modulator (QDSM) and a quadrature DAC for forming I and Q signals.

FIG. 2 shows an exemplary system 200 that includes a quadrature ΔΣ modulator (QDSM) 204 and a quadrature DAC 208 for forming the I and Q signals that would be fed, for example, into an upconversion mixer. A complex input signal 202 is fed into the QDSM 204, which produces a corresponding digital output signal 206 that is fed into the quadrature DAC 208. The quadrature DAC produces corresponding analog I and Q output signals 210 and 218. It should be noted that the QDSM 204 is more efficient than two real ΔΣ modulators when the output is not at baseband [1].

Figure 3:
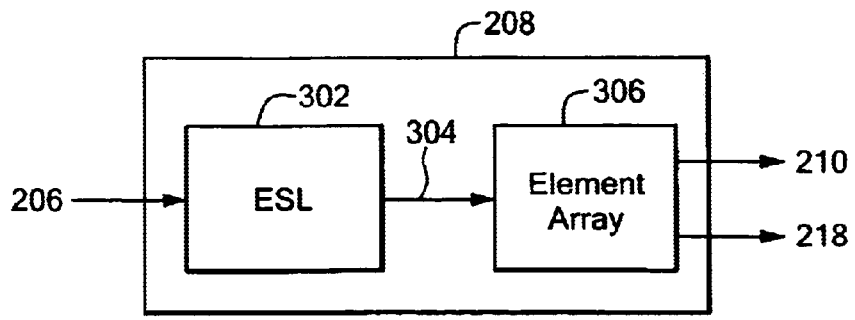
FIG. 3 shows the relevant components of the quadrature DAC.

In order for the quadrature DAC 208 to produce closely matched outputs, the I and Q output signals 210 and 218 are typically produced by drawing from a common element array. FIG. 3 shows the relevant components of the quadrature DAC 208. Among other things, the quadrature DAC 208 includes element selection logic (ESL) 302 and an element array 306. The ESL 302 receives the output signal 206 from the QDSM 204 and produces a selection vector 304 based upon the output signal 206 from the QDSM 204. The selection vector 304 indicates which elements of the element array 306 are used for which output at each timestep.

The ability of the quadrature DAC 208 to match the outputs depends to a large degree on the manner in which the ESL 302 allocates elements from the element array 306 to the two outputs.

Figure 4:
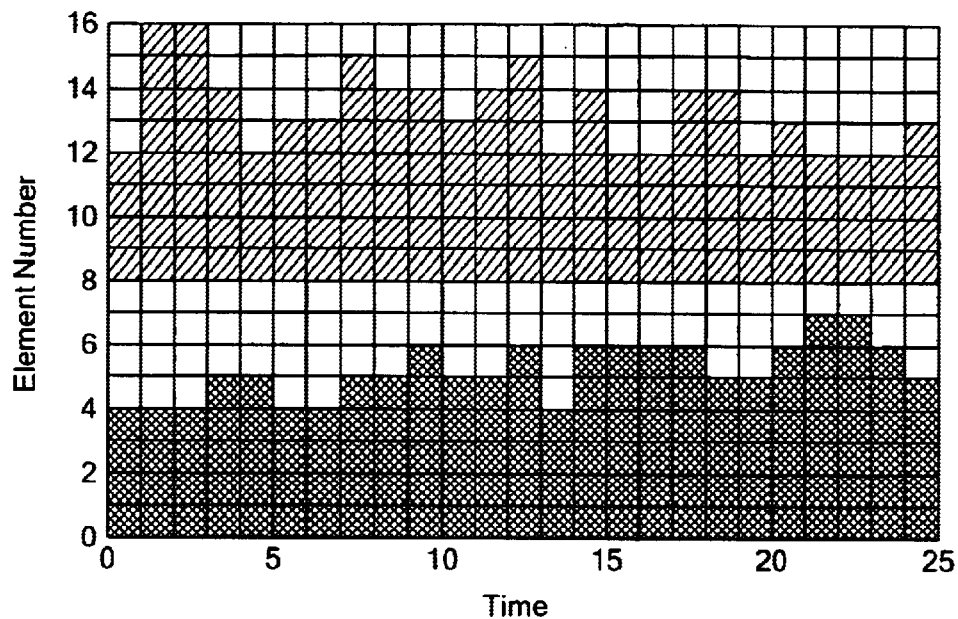
FIG. 4 shows an element array in which half of the array elements are used to produce the I output and the other half of the array elements are used to produce the Q output using a dual thermometer-coding technique as known in the art.

In one element allocation scheme, one portion of the element array 306 is dedicated to the I output 210 and another, non-overlapping portion of the element array 306 is dedicated to the Q output 218. FIG. 4 shows an element array 400 in which half of the array elements (lightly shaded) are used to produce the I output and the other half of the array elements (darkly shaded) are used to produce the Q output (a dual thermometer-coding is demonstrated). Because different sets of array elements are used to produce the I and Q outputs, this element allocation scheme does not match the outputs well. For example, in an exemplary embodiment with an element mismatch of 1%, harmonics of the input signal were visible in the output signal, the IRR was only about 60 dB, and the signal-to-noise ratio (SNR) dropped to about 50 dB. Furthermore, with mismatch shaping applied on each channel individually, the SNR improved and the harmonics were reduced, but the IRR was no better than without mismatch shaping.

Figure 5:
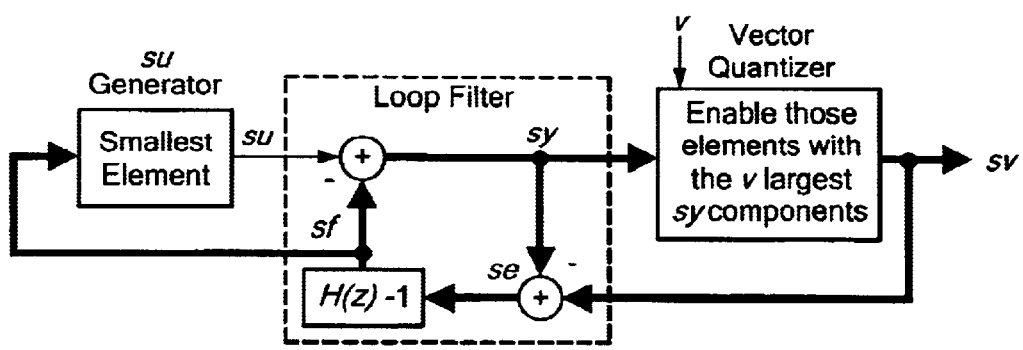
FIG. 5 shows a versatile ESL structure that can be used to implement a variety of mismatch-shaping transfer functions as known in the art.

In another element allocation scheme, the array elements are allocated to the I and Q outputs according to a mismatch-shaping transfer function (MTF). The ESL needs to explictly compute the desired usage (sy) and other vectors, and also needs to store usage information for each array element. FIG. 5 shows a versatile ESL structure 500 that can be used to implement a variety of MTFs, such as those described in [2–4]. Specifically, the versatile ESL structure 500 allocates array elements to the I and Q outputs based upon a MTF H(z). The versatile ESL structure 500 can be adapted to a quadrature MTF by implementing the loop filter with complex arithmetic, changing the su generator from min(sf) to min(Re(sf)+jmin(Im(sf)), and changing the arbitration rule of the vector quantizer so that each component of the selection vector sv is either 0, 1, or j. This latter change is the most involved. The number of ones in sv must equal the real part of v and the number of js in sv must equal the imaginary part of v in order for the I and Q channels to have the value specified by the QDSM. Stability of the ESL is improved by choosing sv such that it minimizes the complex "selection error" vector se=sv−sy, and thus the highest selection priority should be given to elements with the largest sy components. Elements with a large real part are given preference in the selection of elements for the I channel, while elements with a large imaginary part are given preference in the selection of elements for the Q channel. Implementing this decision process in hardware is a challenging task, especially if all decisions must be made in a single clock cycle (although simulations can be used to study the effectiveness of a particular selection strategy without resorting to a hardware realization).

Figure 6:
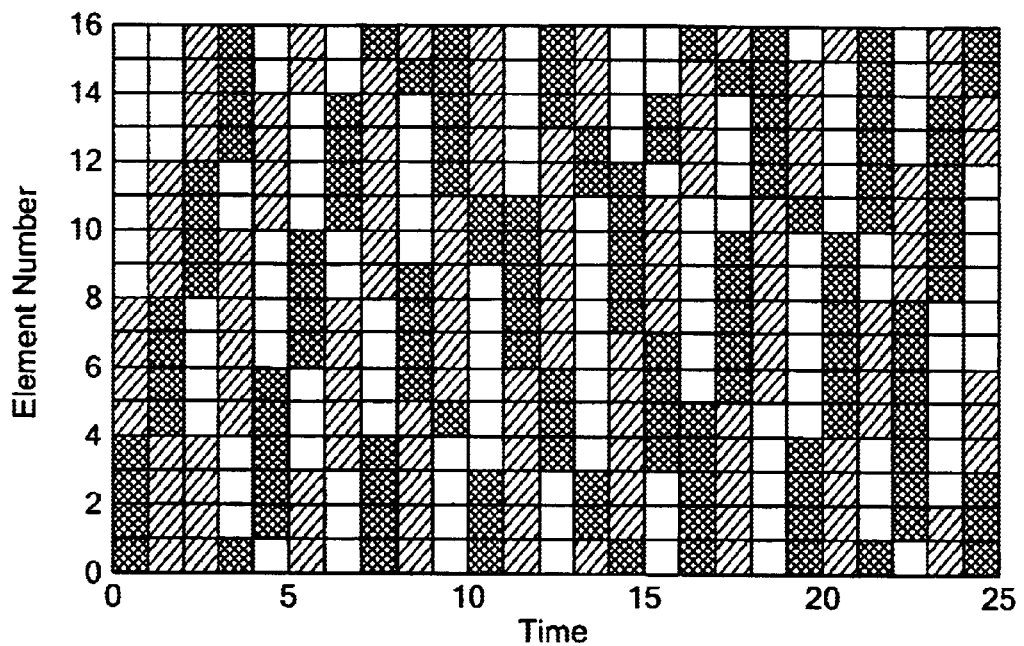
FIG. 6 shows the element usage for an exemplary embodiment using a simple first-order mismatch-shaping transfer function using the function $H(z)=1-z^{-1}$ as known in the art.

FIG. 6 shows the element usage for an exemplary embodiment using a simple first-order MTF using the function $H(z)=1-z^{-1}$. In this embodiment, the QDSM is a fifth-order QDSM employing 9-level quantization of I and Q. The QDSM is of the lowpass variety so it, as well as the MTF, has zeros near DC. A simulation using this MTF resulted in a SNR of 86 dB (the SNR of the ideal QDSM with a half-scale output is 98 dB), with both the image and harmonics virtually eliminated and the noise caused by element mismatch attenuated in the band of interest.

Figure 7:
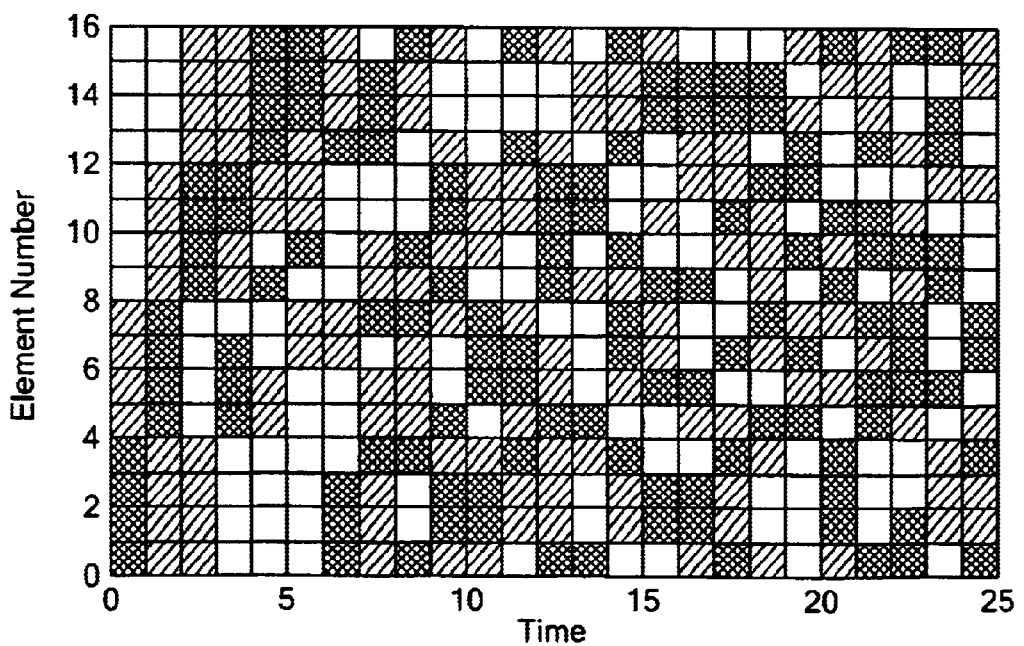
FIG. 7 shows the element usage for an embodiment using a more exotic second-order mismatch-shaping transfer functions as known in the art.

FIG. 7 shows the element usage for an embodiment using a more exotic second-order MTF having a maximum out-of-band gain of 1.5 and transmission zeros optimized for an oversampling ratio (OSR) of 16. In this embodiment, the QDSM is again a fifth-order QDSM employing 9-level quantization of I and Q. The QDSM is of the lowpass variety so it, as well as the MTF, has zeros near DC. The QDSM also has transmission zeros optimized for an OSR of 16, but the out-of-band gain of the QDSM's NTF is three in order to take greater advantage of its multibit quantizers. A simulation using this MTF resulted in a SNR of 90 dB (the SNR of the ideal QDSM with a half-scale output is 98 dB), with both the image and harmonics virtually eliminated and the noise caused by element mismatch attenuated in the band of interest.

In an embodiment of the present invention, the array elements are allocated to the I and Q outputs without explicitly computing the desired usage and other vectors and without storing usage information for each array element. The element array is treated like a bi-directional circular array such that there is a predetermined sequence from any given array element through the remaining array elements and back to that array element in both directions. For convenience, the element array includes N array elements that are numbered from zero to (N−1). The array elements are allocated to the two DAC channels as needed in opposite directions from a common anchor point such that the array elements that have been allocated to each channel are contiguous within the circular array. All array elements are available for allocation to both DAC channels, although no array element can be allocated to both DAC channels simultaneously. A collision resolution scheme is used to prevent overlapping allocations of array elements. Pointers are used to keep track of the array elements allocated to the two channels, making implementation relatively simple.

In an exemplary embodiment of the present invention, three pointers are used to keep track of the array elements allocated to the two channels. An anchor pointer (pA) is used to indicate the starting allocation point for both channels. An I channel pointer (pI) is used to indicate the ending allocation point for the I channel relative to the anchor pointer in a particular direction (dI). A Q channel pointer (pQ) is used to indicate the ending allocation point for the Q channel relative to the anchor pointer in the opposite direction to the I channel allocation (dQ=−dI).

Initially, all three pointers are set to the same array element (typically array element number zero). Elements are then allocated to the I channel in one direction of the bi-directional circular array and to the Q channel in the opposite direction of the bi-directional circular array. In order to simplify array element allocation, the pointers are typically updated using modulo(N) arithmetic. Thus, for example, the array element following array element number (N−1) is array element zero, and the array element preceding array element number zero is array element number (N−1). The immediate history of array elements allocated to the I channel extend contiguously from the anchor pointer (pA) to the channel I pointer (pI) in direction dI, while the immediate history of array elements allocated to the Q channel extend contiguously from the anchor pointer (pA) to the channel Q pointer (pQ) in direction dQ.

Element allocation continues until contention occurs, at which time the contention is resolved. As part of the contention resolution scheme, the anchor point might change and/or the allocation directions for the two channels might change. In order to obtain good balance between the two channels, the contention resolution scheme typically favors resolutions that give one or both channels the greatest opportunity to complete a rotation. Thus, for example, when the desired allocations for the two channels overlap, priority is typically given to the channel having the most array elements allocated.

Various aspects of the present invention can be demonstrated by example. FIGS. 8A–8I show various element allocation situations that can be encountered in an exemplary embodiment of the present invention. For convenience, the elements are shown arranged as a ring. The current and historical usage of elements for the I channel is indicated on the outer circle, while the current and historical usage of elements for the Q channel is indicated on the inner circle. Initially, as shown in FIG. 8A, the anchor point is set at zero, elements for the I channel are selected counterclockwise on the outer circle, and elements for the Q channel are selected clockwise on the inner circle. This continues, as shown in FIG. 8B where there are many unused elements and no contention, until contention exists between the two channels, at which time one of the situations shown in FIGS. 8C–8E will exist. The priority channel is preferably the channel that has used the most elements, which ensures that a rotation will complete if it can, although it should be noted that assigning priority can be replaced by other schemes that place similar emphasis on completing rotations. FIG. 8C depicts a situation in which there is contention with enough unused elements for the priority channel (in this case, the I channel), in which case the unused elements are allocated to the priority channel, the anchor point changes, the allocations for both channels reverse direction, and the non-priority channel is given its allocation. FIG. 8D depicts a situation in which there is contention without enough unused elements for the priority channel and without the priority channel completing a rotation, in which case the unused elements are allocated to the priority channel, the anchor point changes, the allocations for both channels reverse directions, the priority channel is allocated any additional elements that it needs, and the non-priority channel is given its allocation. FIG. 8E depicts a situation in which there is contention and the priority channel completes a rotation, in which case the anchor point changes but the rotational directions are unchanged. If there are no unused elements, then one of the situations shown in FIGS. 8F–8I will exist. FIG. 8F depicts a situation in which there are no unused elements, no completed rotations, and no contention. FIG. 8G depicts a situation in which there are no unused elements, one channel completes a rotation, but there is no contention. FIG. 8H depicts a situation in which there are no unused elements, only one channel completes a rotation, and contention exists, in which case the anchor point changes but the rotational directions are unchanged. FIG. 8I depicts a situation in which there are no unused elements, both channels complete rotations, and contention exists, in which case the anchor point changes but the rotational directions are unchanged. These various conditions can be detected by various arithmetic tests, making it easy to implement in hardware.

The exemplary element allocation scheme described above with reference to FIGS. 8A–8I is further demonstrated below with reference to exemplary MATLAB code used to simulate the element allocation scheme. Four code segments (functions) are shown, namely a qmm1 function, a qmm1CDE function, a qmm1HI function, and a selectElements function. The qmm1 function is the main function. The qmm1 function initializes the pointers (case A), and performs the various arithmetic tests to identify cases B through I. The qmm1 function handles cases B, F, and G, invokes the qmm1CDE function to handle cases C, D, and E, and invokes the qmm1HI function to handle cases H and I. The selectElements function is invoked by the other three functions in order to select specified elements from the element array in a specified direction. For convenience, certain elements of the MATLAB code have been omitted, including debug code, extraneous comments, and certain library functions. The basic operation of the MATLAB code can be understood without reference to these omitted elements.

```
function sv = qmm1 (v,Nel, dbg)
N = length(v); sv = zeros(Nel,N);
% Starting configuration (case a)
pA = 0;
pI = 0;          pQ = 0;
dI = 1;          dQ = -1;
for i=1:N
    nI = real(v(i));                nQ = imag(v(i));
    n_usedI = (pI-pA)/dI;           n_usedQ = (pQ-pA)/dQ;
    pIp = pI + nI*dI;               pQp = pQ + nQ*dQ;
    svI = selectElements(pI,pIp,Nel,dI);   svQ = selectElements
                                           (pQ,pQp,NEl,dQ);
    nC = sum(svI & svQ);
    if nC==0                        % No contention (cases b,f,g)
        if (pIp-pA)/dI >= Nel       % I wrapped
            pI = pIp - dI*Nel;
        else
            pI = pIp;
        end
        if (pQp-pA)/dQ >= Nel       % Q wrapped
            pQ = pQp - dQ*Nel;
        else
            pQ = pQp;
        end
    else                            % Contention
        unusedI = Nel - n_usedI;
        unusedQ = Nel - n_usedQ;
        if unusedI + unusedQ > Nel  % Contention over unused
                                    elements (cases c,d,e)
            if n_usedI > n_usedQ|(n_usedI == n_usedQ
            & nI >= nQ)
                [pA pI pQ dI dQ svI svQ] = qmm1CDE
                (pA,pI,pQ,dI,dQ,nI,nQ,Nel);
            else
                [pA pQ pI dQ dI svQ svI] = qmm1CDE
                (pA,pQ,pI,dQ,dI,nQ,nI,Nel);
            end
        elseif nI > unusedI         % Contention and I completes
                                    a rotation
            [pA pI pQ dI dQ dI svI svQ] = qmm1HI
            (pA,pI,pQ,dI,dQ,nI,nQ,Nel);
        elseif nQ > unusedQ         % Contention and Q completes
                                    a rotation
            [pA pQ pI dQ svQ svI] = qmmm1HI
            (pA,pQ,pI,dQ,dI,nQ,nI,Nel);
        else
            error(This can"t happen!');
        end
    end
    sv(:,i) = svI' + 1i*svQ';
end
return
function [pA,pX,pY,dX,dY,svX,svY] = qmm1CDE
(pA,pX,pY,dX,dY,nX,nY,Nel)
% Select elements according to cases c,d,e
n_usedX = (pX-pA)/dX;
n_usedY = (pY-pA)/dY;
n_unused = Nel - n_usedX - n_usedY;
if n_unused >= nX
    % Enough unused elements for the priority (X) channel (case c)
    pXp = pX+nX*dX;
    svX = selectElements(pX,pXp,Nel,dX);
    nY1 = n_unused -nX;
    pYp = pA-(nY-nY1)*dY;
    svY = selectElements(pY,pY+nY1*dY,Nel,dY)|selectElements
    (pA,pYp,Nel,-dY);
    pA = mod(pXp,Nel);
    dX = -dX;
    dY = -dY;
    pX = pA+dX*(n_usedX+nX);
    pY = pA+dY*(n_usedY+nY);
elseif nX < Nel - n_usedX
    % Priority channel has enough unused elements (case d)
    pXp = pA-(nX-n_unused)*dX;
    svX = selectElements(pX,pX+n_unused*dX,Nel,dX)|selectElements
    (pA,pXp,Nel,-dX);
    svY = selectElements(pA,pA-nY*dY,Nel,-dY);
    pA = mod(pY,Nel);
    dX = -dX;
    dY = -dY;
    pX = pA+dX*(n_usedX+nX);
    pY = pA+dY*(n_usedY+nY);
else
    % Priority channel completes a rotation (case e)
    pAp = mod(pA - nY*dY,Nel);
    pXp = pAp + (nX-(Nel-n_usedX))*dX;
    svX = selectElements(pX,pA+Nel*dX,Nel,dX)|selectElements
    (pAp,pXp,Nel,dX);
    svY = selectElements(pA,pA-nY*dY,Nel,-dY);
    pX = pXp;
    pA = pAp;
    pY = pA+dY*(n_usedY+nY);     % pY is unchanged unless
                                 pA wrapped
end
return
function [pA,pX,pY,dX,dY,svX,svY] = qmm1HI
(pA,pX,pY,dX,dY,nX,nY,Nel)
% Select elements according to cases h,i
% X-channel completes a rotation
% (The code looks exactly like case e, except for the pY calculation)
n_usedX = (pX-pA)/dX;
n_usedY = (pY-pA)/dY;
pAp = mod(pA - nY*dY,Nel);
```

-continued

```
pXp = pAp + (nX-(Nel-n_usedX))*dX;
svX = selectElements(pX,pA+Nel*dX,Nel,dX)|selectElements
(pAp,pXp,Nel,dX);
svY = selectElements(pA,pA-nY*dY,Nel,-dY);
pX = pXp;
pA = pAp;
pY = pA+dY*mod(n_usedY+nY,Nel);   % pY is unchanged unless pA
wrapped return
function s=selectElements(a,b,n,d)
% Select elements from a to b, in direction d.
% a = 0 is the left end; a and b are interpreted modulo n
if d<0
    tmp = a;
    b = tmp;
end
if a>b|b>a+n
    fprintf(2,'%s: a=%d, b=%d, n=%d,d=%d\n',mfilename,a,b,n,d);
    error('Invalid arguments')
    return
end
if b==a+n
    s = ones (l,n);
    return
end
a = mod(a,n);
b = mod(b,n);
s = zeros(l,n);
if b>=a
    s(a+1:b) = 1;
else
    s(a+1:end) = 1;
    s(1:b) = 1;
end
```

Figure 9:
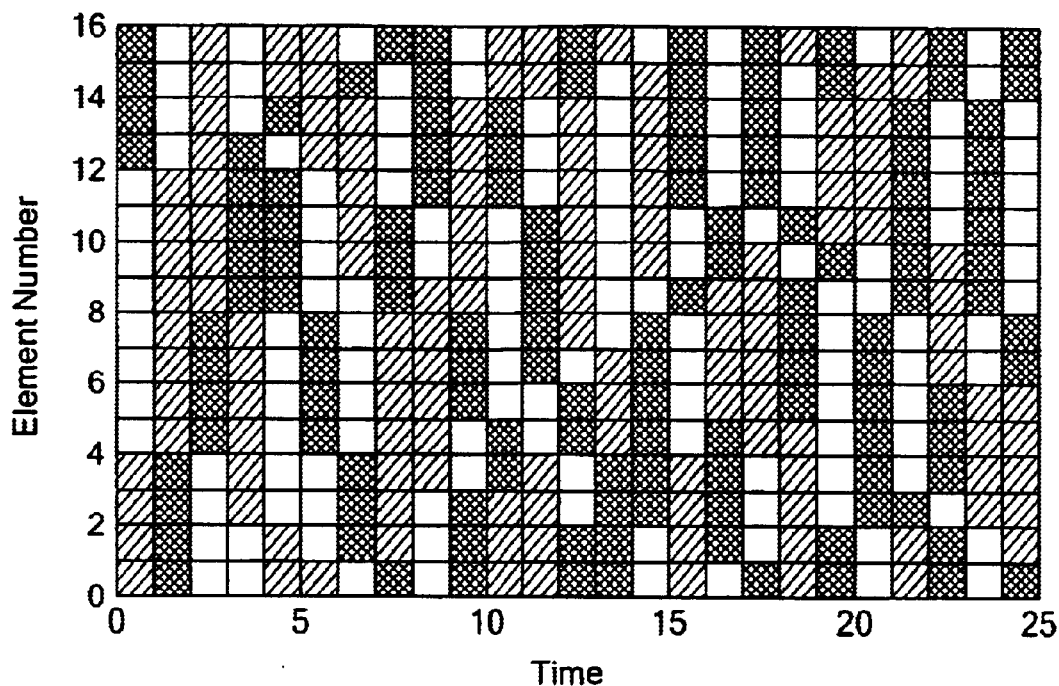
FIG. 9 shows the element usage for an exemplary embodiment of the present invention using a simplified quadrature element selection strategy.

FIG. 9 shows the element usage for an exemplary embodiment of the present invention using the simplified quadrature element selection strategy. Although the cumulative usage of elements by each channel form contiguous blocks, this figure shows that, sometimes, the instantaneous usage of elements within a channel is contiguous and sometimes it is not. A simulation using this element allocation scheme resulted in a SNR of about 77 dB, with both the image and harmonics virtually eliminated and the noise caused by element mismatch attenuated in the band of interest. This SNR is about 9 dB lower than what can be achieved with the versatile ESL 500 and a first-order MTF, although the implementation in hardware is significantly simpler.

Figure 10:
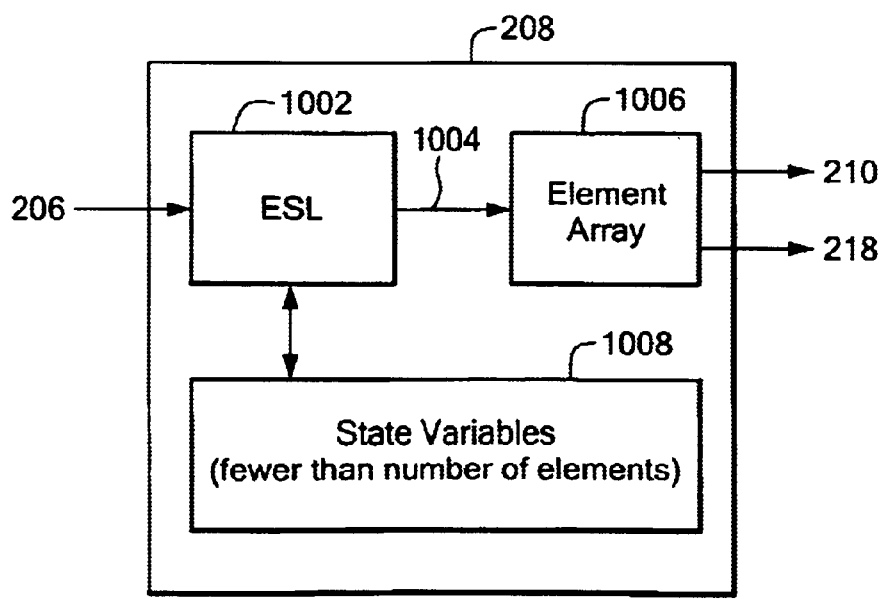
FIG. 10 shows the relevant components of a quadrature DAC in accordance with an embodiment of the present invention.

FIG. 10 shows the relevant components of a quadrature DAC 208 in accordance with an embodiment of the present invention. Among other things, the quadrature DAC 208 includes element selection logic (ESL) 1002, an element array 1006, and state variables 1008. The number of state variables 1008 is preferably less than the number of elements in the element array 1006. The ESL 1002 receives the output signal 206 from the QDSM 204 and produces a selection vector 1004 based upon the output signal 206 from the QDSM 204. The selection vector 1004 indicates which elements of the element array 1006 are used for which output at each timestep. The ESL 1002 maintains the state variables 1008, which typically include an anchor pointer and a separate pointer for each of the two DAC channels so that elements can be allocated to the two channels through the bi-directional circular array in opposite directions, as described above.

Figure 11:
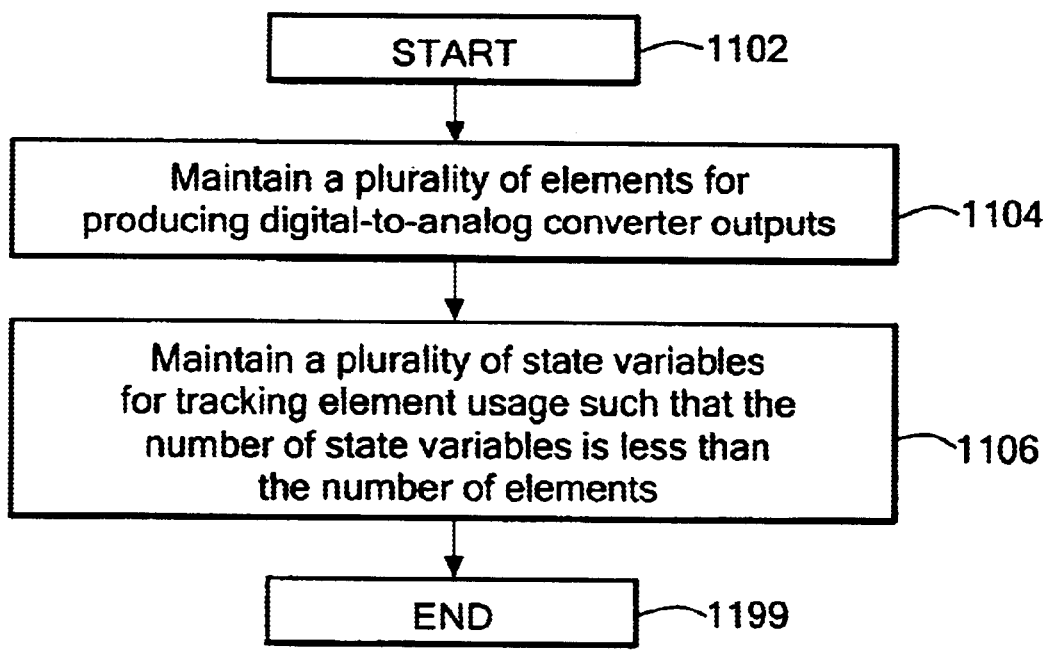
FIG. 11 is a logic flow diagram showing exemplary logic for managing elements in accordance with an embodiment of the present invention.

FIG. 11 is a logic flow diagram showing exemplary logic for managing elements in accordance with an embodiment of the present invention. Beginning in block 1102, the logic a plurality of elements for producing digital-to-analog converter outputs, in block 1104. The logic maintains a plurality of state variables for tracking element usage such that the number of state variables is less than the number of elements, in block 1106. The logic ends in block 1199.

Figure 12:
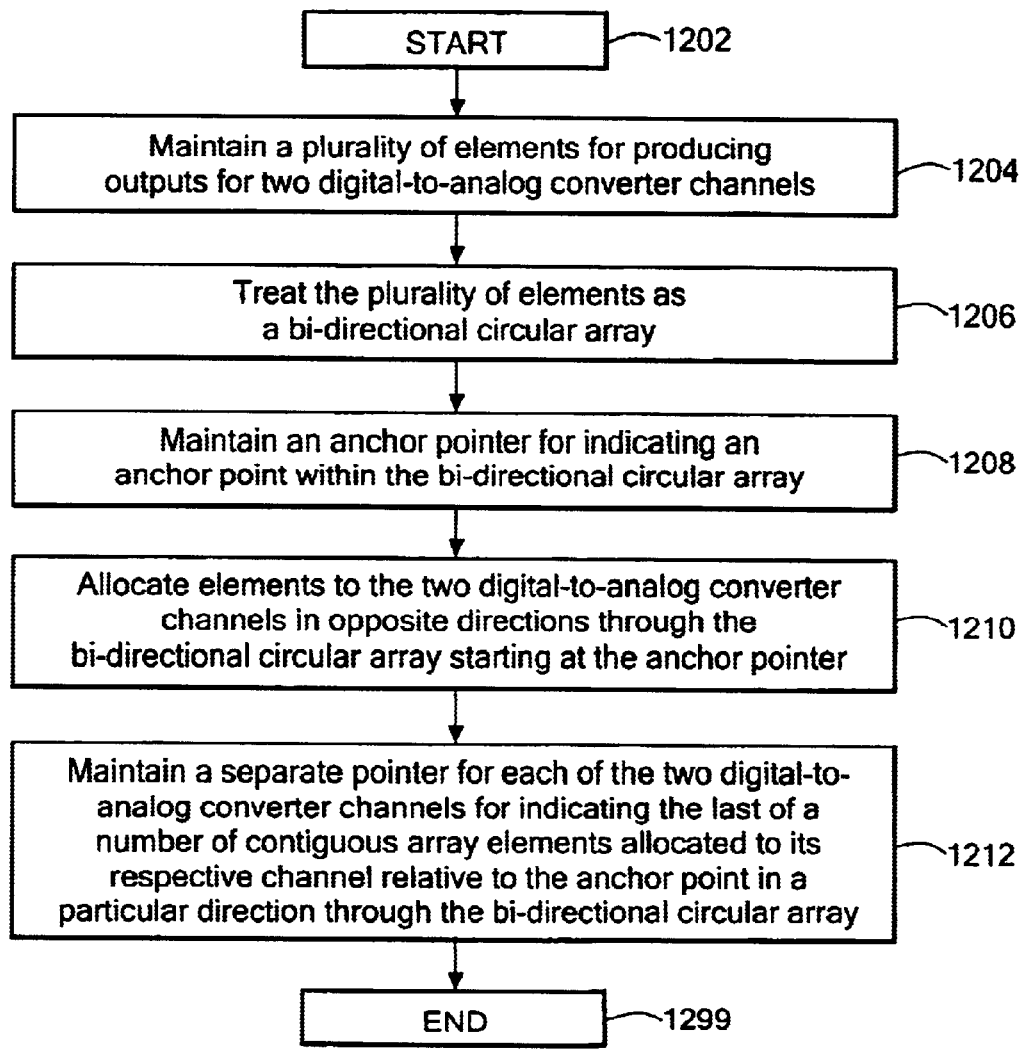
FIG. 12 is a logic flow diagram showing exemplary element selection logic in accordance with an embodiment of the present invention.

FIG. 12 is a logic flow diagram showing exemplary element selection logic in accordance with an embodiment of the present invention. Starting in block 1202, the logic a plurality of elements for producing outputs for two digital-to-analog converter channels, in block 1204. The logic treats the plurality of elements as a bi-directional circular array, in block 1206. The logic maintains an anchor pointer for indicating an anchor point within the bi-directional circular array, in block 1208. The logic allocates elements to the two digital-to-analog converter channels in opposite directions through the bi-directional circular array starting at the anchor pointer, in block 1210. The logic maintains a separate pointer for each of the two digital-to-analog converter channels for indicating the last of a number of contiguous array elements allocated to its respective channel relative to the anchor point in a particular direction through the bi-directional circular array, in block 1212. The logic ends in block 1299.

Figure 13:
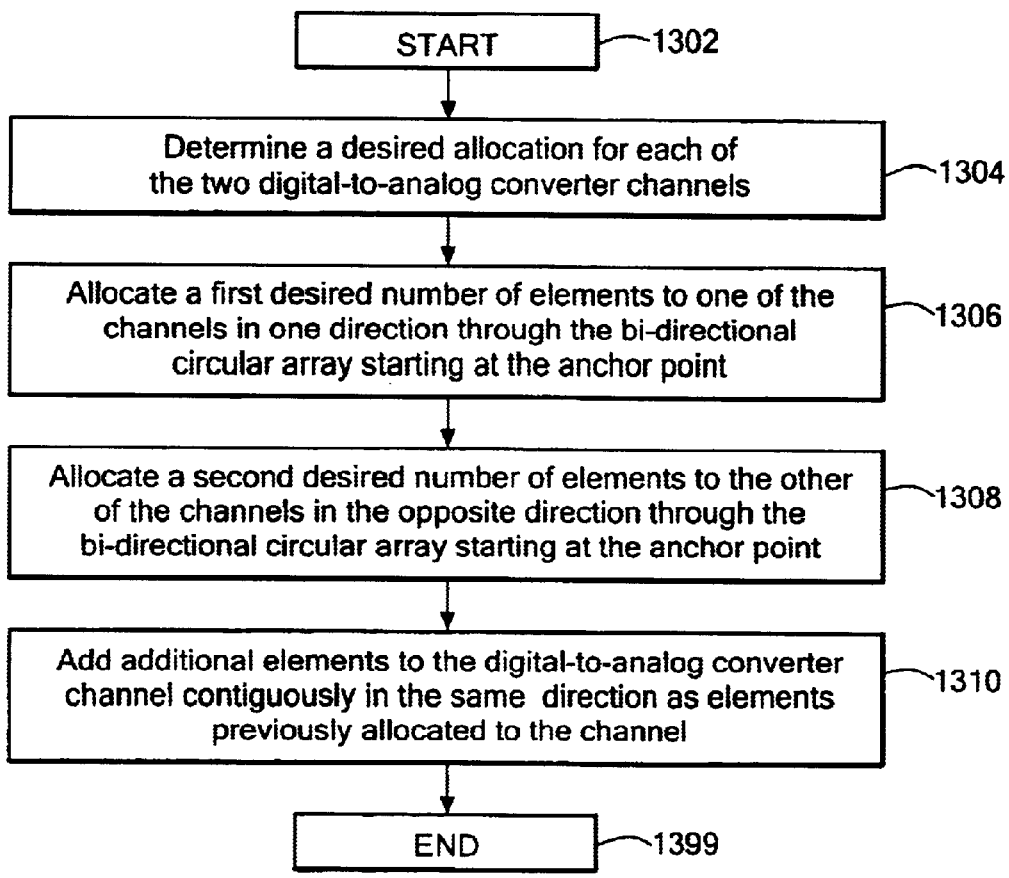
FIG. 13 is a logic flow diagram showing exemplary element selection logic for allocating elements in accordance with an embodiment of the present invention.

FIG. 13 is a logic flow diagram showing exemplary element selection logic for allocating elements in accordance with an embodiment of the present invention. Starting in block 1302, the logic determines a desired allocation for each of the two digital-to-analog converter channels, in block 1304. The logic allocates a first desired number of elements to one of the channels in one direction through the bi-directional circular array starting at the anchor point, in block 1306. The logic allocates a second desired number of elements to the other of the channels in the opposite direction through the bi-directional circular array starting at the anchor point, in block 1308. The logic may add additional elements to the digital-to-analog converter channel contiguously in the same direction as elements previously allocated to the channel, in block 1310. The logic ends in block 1399.

Figure 14:
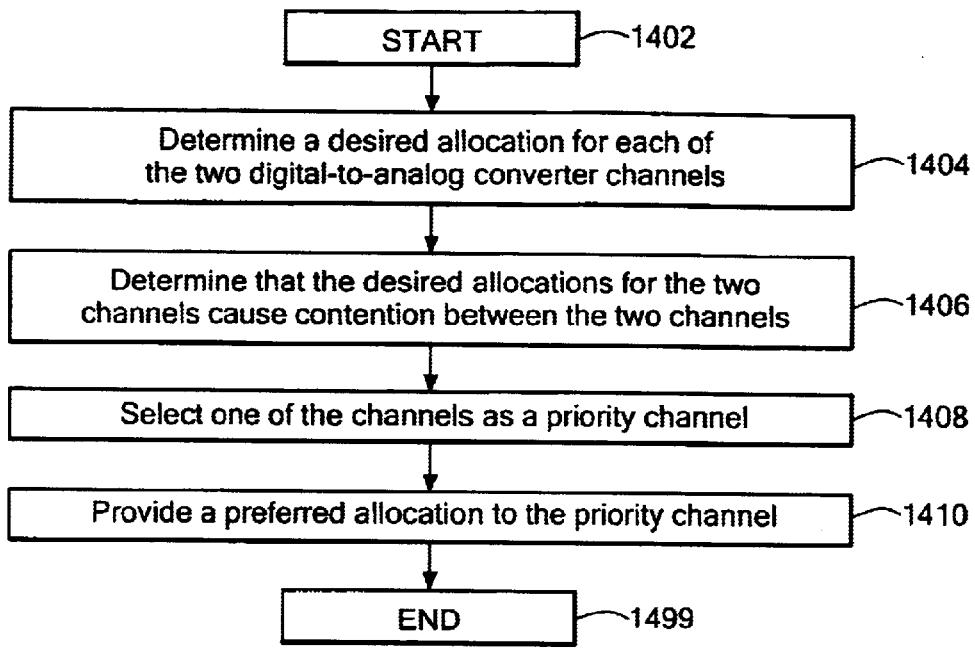
FIG. 14 is a logic flow diagram showing exemplary element selection logic for allocating elements when there is contention in accordance with an embodiment of the present invention.

FIG. 14 is a logic flow diagram showing exemplary element selection logic for allocating elements when there is contention in accordance with an embodiment of the present invention. Starting in block 1402, the logic determines a desired allocation for each of the two digital-to-analog converter channels, in block 1404. Upon determining that the desired allocations for the two channels cause contention between the two channels, in block 1406, the logic preferably selects one of the channels as a priority channel, in black 1408, and provides a preferred allocation to the priority channel, in block 1410. The logic ends in block 1499.

Figure 15:
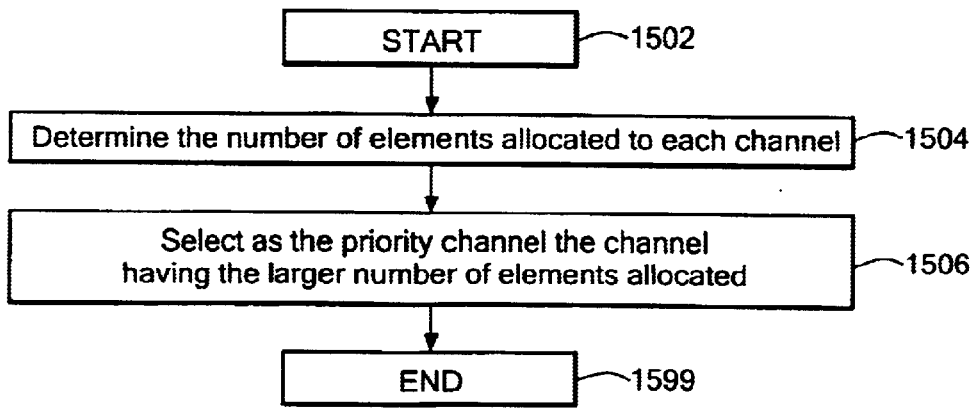
FIG. 15 is a logic flow diagram showing exemplary element selection logic for selecting a priority channel in accordance with an embodiment of the present invention.

FIG. 15 is a logic flow diagram showing exemplary element selection logic for selecting a priority channel in accordance with an embodiment of the present invention. Starting in block 1502, the logic determines the number of elements allocated to each channel, in block 1504. The logic then selects as the priority channel the channel having the larger number of elements allocated, in block 1506. The logic ends in block 1599.

Figure 16:
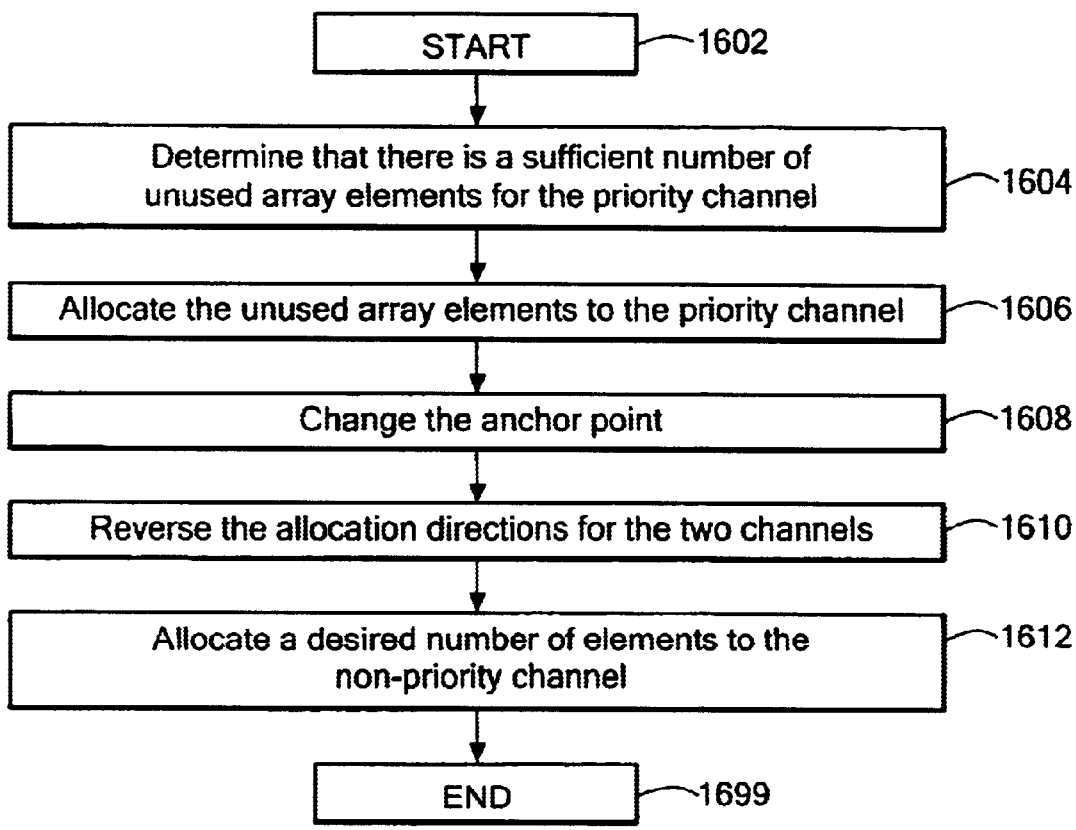
FIG. 16 is a logic flow diagram showing exemplary element selection logic for providing a preferred allocation to the priority channel when there is a sufficient number of unused array elements for the priority channel, in accordance with an embodiment of the present invention.

FIG. 16 is a logic flow diagram showing exemplary element selection logic for providing a preferred allocation to the priority channel when there is a sufficient number of unused array elements for the priority channel, in accordance with an embodiment of the present invention. Starting in block 1602, and upon determining that there is a sufficient number of unused array elements for the priority channel, in block 1604, the logic allocates the unused array elements to the priority channel, in block 1606. The logic then changes the anchor point, in block 1608, and reverses the allocation directions for the two channels, in block 1610. The logic then allocates a desired number of elements to the non-priority channel, in block 1612. The logic ends in block 1699.

Figure 17:
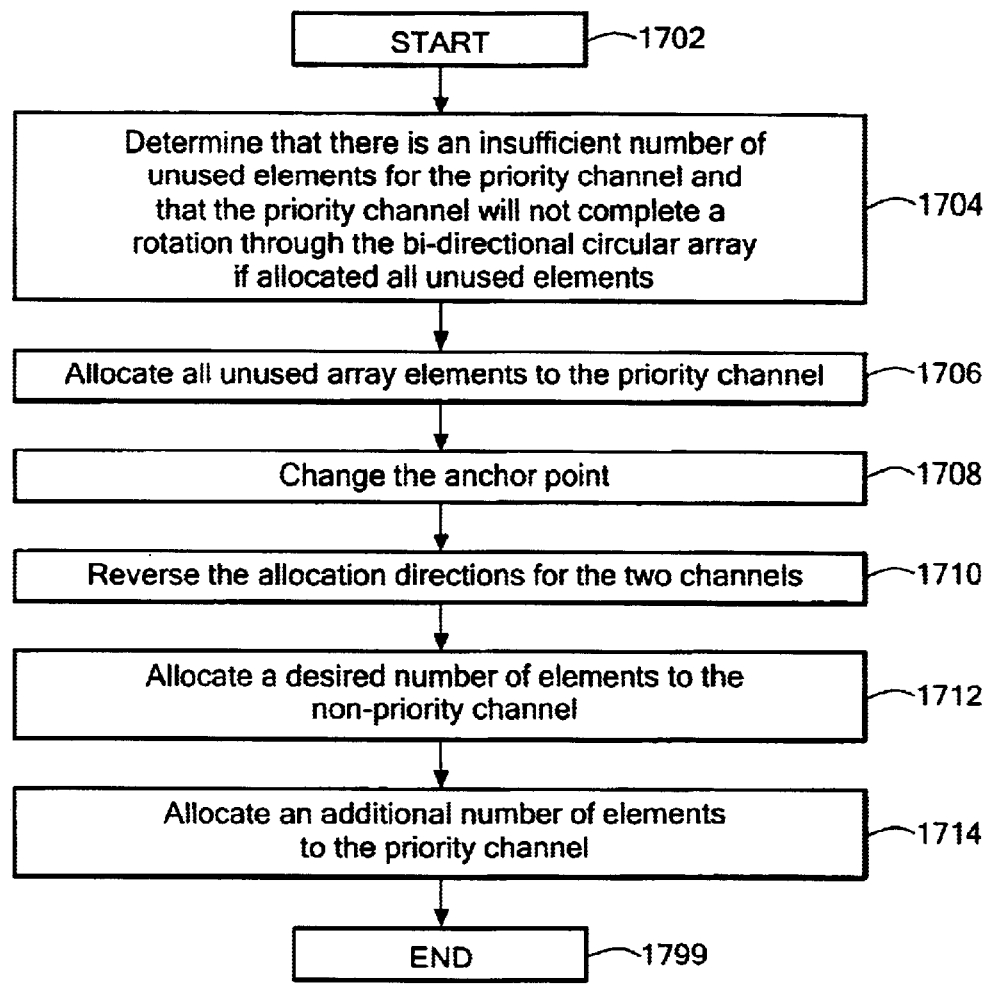
FIG. 17 is a logic flow diagram showing exemplary element selection logic for providing a preferred allocation to the priority channel when there is an insufficient number of unused array elements for the priority channel and the priority channel will not complete a rotation through the bi-directional circular array if allocated all unused elements, in accordance with an embodiment of the present invention.

FIG. 17 is a logic flow diagram showing exemplary element selection logic for providing a preferred allocation to the priority channel when there is an insufficient number of unused array elements for the priority channel and the priority channel will not complete a rotation through the bi-directional circular array if allocated all unused elements, in accordance with an embodiment of the present invention. Starting in block 1702, and upon determining that there is an insufficient number of unused elements for the priority channel and that the priority channel will not complete a rotation through the bi-directional circular array if allocated all unused elements, in block 1704, the logic allocates all unused array elements to the priority channel, in block 1706. The logic then changes the anchor point, in block 1708, and reverses the allocation directions for the two channels, in block 1710. The logic then allocates a desired number of elements to the non-priority channel, in block 1712, and allocates an additional number of elements to the priority channel, in block 1714. The logic ends in block 1799.

Figure 18:
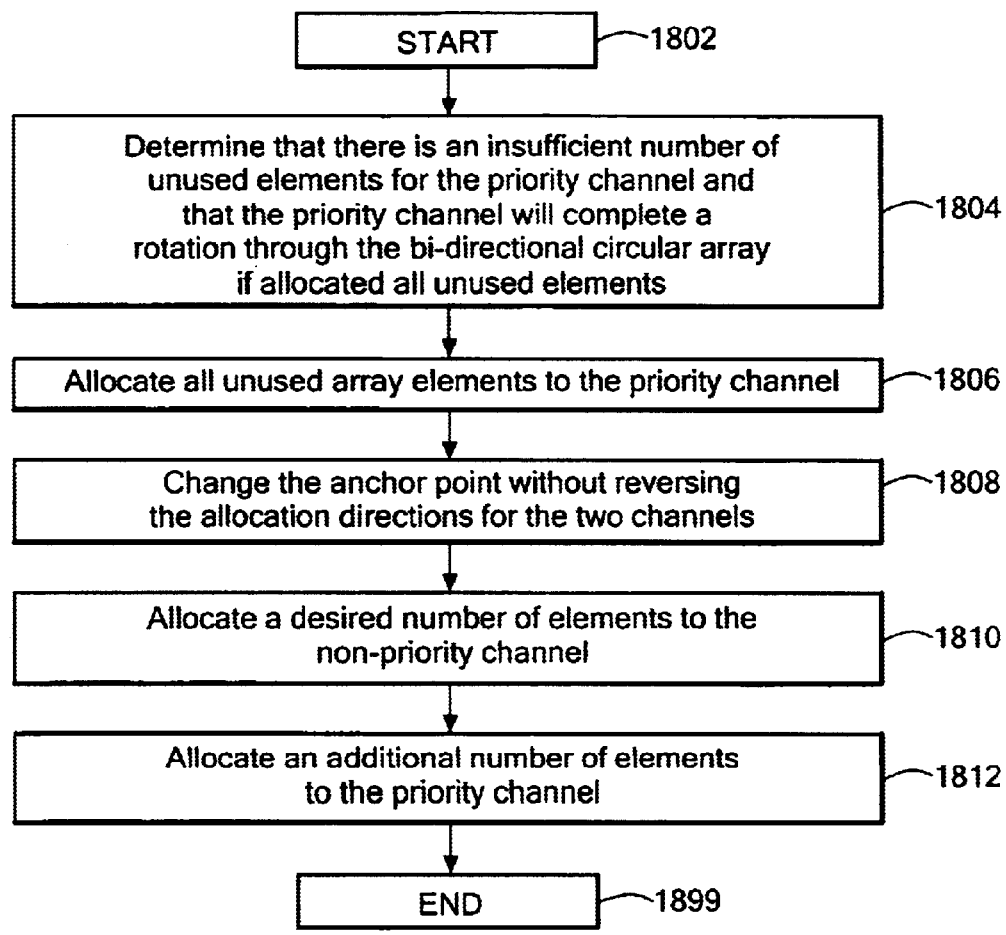
FIG. 18 is a logic flow diagram showing exemplary element selection logic for providing a preferred allocation to the priority channel when there is an insufficient number of unused array elements for the priority channel and the priority channel will complete a rotation through the bi-directional circular array if allocated all unused elements, in accordance with an embodiment of the present invention.

FIG. 18 is a logic flow diagram showing exemplary element selection logic for providing a preferred allocation to the priority channel when there is an insufficient number of unused array elements for the priority channel and the priority channel will complete a rotation through the bi-directional circular array if allocated all unused elements, in accordance with an embodiment of the present invention. Starting in block 1802, and upon determining that there is an insufficient number of unused elements for the priority channel and that the priority channel will complete a rotation through the bi-directional circular array if allocated all unused elements, in block 1804, the logic allocates all unused array elements to the priority channel, in block 1806. The logic then changes the anchor point without reversing the allocation directions for the two channels, in block 1808. The logic then allocates a desired number of elements to the non-priority channel, in block 1810, and allocates an additional number of elements to the priority channel, in block 1812. The logic ends in block 1899.

Figure 19:
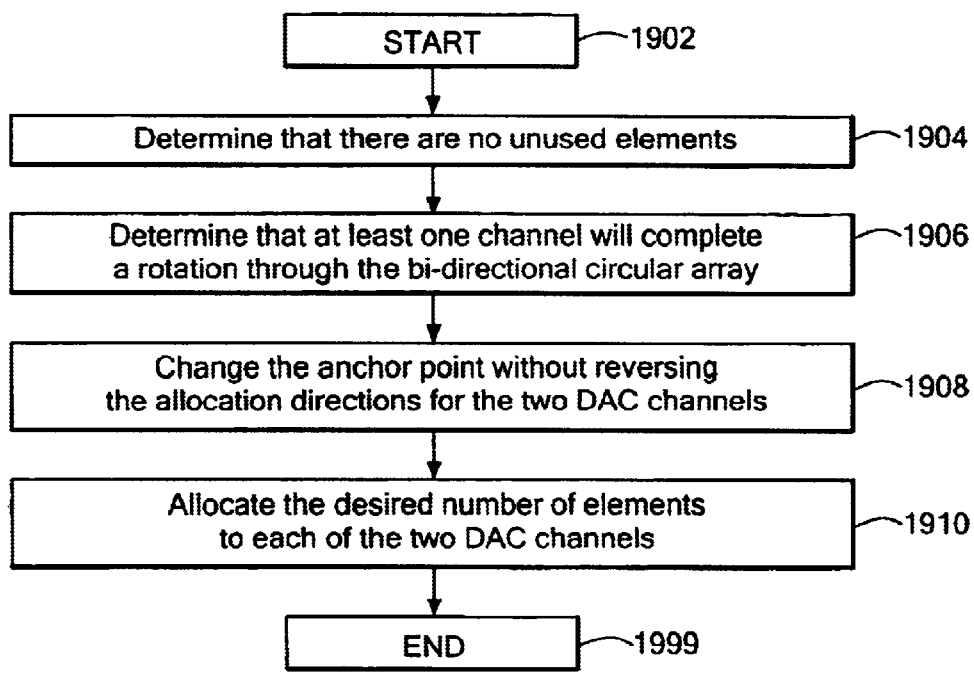
FIG. 19 is a logic flow diagram showing exemplary element selection logic for providing a preferred allocation to the priority channel when there are no unused elements, in accordance with an embodiment of the present invention.

FIG. 19 is a logic flow diagram showing exemplary element selection logic for providing a preferred allocation to the priority channel when there are no unused elements, in accordance with an embodiment of the present invention. Starting in block 1902, and upon determining that there are no unused elements, in block 1904, and upon determining that at least one channel will complete a rotation through the bi-directional circular array, in block 1906, the logic changes the anchor point without reversing the allocation directions for the two channels, in block 1908. The logic then allocates the desired number of elements to each of the two channels, in block 1910. The logic ends in block 1999.

It should be noted that the MATLAB code is used herein to demonstrate various aspects of the invention, and should not be construed to limit the present invention to any particular logic flow or logic implementation. The described logic may be partitioned into different logic blocks (e.g., programs, modules, functions, or subroutines) without changing the overall results or otherwise departing from the true scope of the invention. Often times, logic elements may be added, modified, omitted, performed in a different order, or implemented using different logic constructs (e.g., logic gates, looping primitives, conditional logic, and other logic constructs) without changing the overall results or otherwise departing from the true scope of the invention.

It should be noted that, in the exemplary embodiment described above, the predetermined sequence through the bi-directional element array need not be fixed. Rather, the predetermined sequence through the bi-directional element array can change over time. For example, the elements may be "renumbered" after rotations are complete.

It should be noted that the mismatch-shaping techniques of the present invention can be extended to a DAC having more than two outputs. Specifically, the array elements are shared by at least three DAC outputs and are allocated so as to substantially average out errors in the at least three outputs induced by element mismatch over time.

It should be noted that the mismatch-shaping techniques of the present invention can be extended to a differential DAC. In a single-ended DAC, elements can be connected to I or Q or left unconnected. This choice is captured in the allowed alphabet for the vector quantizer, namely $\{1, j, 0\}$. In a differential DAC, the alphabet is $\{+1, -1, +j, -j\}$ or $\{+1, -1, 0, +j, -j\}$.

It should be noted that the present invention is in no way limited to any particular scheme for allocating array elements among the various DAC outputs. In an exemplary embodiment of the invention described above, mismatch-shaping is applied to a quadrature DAC by treating the element array as a bi-directional array and allocating elements to the two DAC outputs in opposite directions through the bi-directional array from a common anchor point, although the present invention is in no way limited to such an implementation. This "bi-directional" implementation does not scale well to multi-bit DACs having more than two outputs.

If element rotation [5], data-directed scrambling [6], or any other dynamic element matching scheme for a single-output DAC is applied to two halves of the element array, then mismatch errors for each channel are shaped, but imbalance between the full-scales of the two channels will result in poor image rejection. Thus, in an embodiment of the present invention, the element array is divided into two halves in such a way that the full-scales of the resulting DACs are substantially equal. This "static element partitioning" can be accomplished, for example, by characterizing all of the elements in the element array and then splitting them up so that the two halves are nearly evenly divided. Dynamic selection would then be applied to each half individually.

It is possible (but not efficient) to make a differential DAC out of two single-ended DACs. To make the equivalent of a differential DAC out of two single-ended DACs, the data stream v+M/2 is applied to one DAC, and the data stream M/2-v is applied to the other DAC. Since the range of the input data (v) to a differential DAC is $[-M/2, M/2]$, the range of the data to each single-ended DAC is $[0, M]$, and thus the single-ended mismatch-shaping schemes will work. The reason that this approach is inefficient is that a differential DAC typically needs only 2M elements, and two single-ended DACs would typically need 2*2M=4M elements.

It is possible to effectively transform lowpass differential mismatch-shaping to bandpass differential mismatch-shaping. The process is to multiply the modulator data by the sequence $(1, -j, -1, j, \ldots)$, which is equal to a $-fs/4$ complex sine wave, apply this new data to a differential quadrature mismatch-shaping algorithm (such as the canonical algorithm described above), and then multiply the selection vector sequence by a complex sine wave at $+fs/4$ to arrive at a selection-vector sequence that has mismatch noise shaped away from $fs/4$. A similar technique can produce mismatch noise nulls at $-fs/4$ and $fs/2$.

It should be noted that N-path filtering such as described in [7] can be used to effectively transform the frequency characteristics of a quadrature mismatch-shaping system. The N-path transformation $z \to z^N$ and the pseudo N-path $z \to -z^N$ are both applicable.

The present invention may be embodied in many different forms, including, but in no way limited to, computer program logic for use with a processor (e.g., a microprocessor, microcontroller, digital signal processor, or general purpose computer), programmable logic for use with a programmable logic device (e.g., a Field Programmable Gate Array (FPGA) or other PLD), discrete components, integrated circuitry (e.g., an Application Specific Integrated Circuit (ASIC)), or any other means including any combination thereof. In a typical embodiment of the present invention, predominantly all of the element allocation logic is implemented in hardware.

Computer program logic implementing all or part of the functionality previously described herein may be embodied in various forms, including, but in no way limited to, a source code form, a computer executable form, and various intermediate forms (e.g., forms generated by an assembler, compiler, linker, or locator). Source code may include a series of computer program instructions implemented in any of various programming languages (e.g., an object code, an assembly language, or a high-level language such as Fortran, C, C++, JAVA, or HTML) for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

The computer program may be fixed in any form (e.g., source code form, computer executable form, or an intermediate form) either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), a PC card (e.g., PCMCIA card), or other memory device. The computer program may be fixed in any form in a signal that is transmittable to a computer using any of various communication technologies, including, but in no way limited to, analog technologies, digital technologies, optical technologies, wireless technologies (e.g., Bluetooth), networking technologies, and internetworking technologies. The computer program may be distributed in any form as a removable storage medium with accompanying printed or electronic documentation (e.g., shrink wrapped software), preloaded with a computer system (e.g., on system ROM or fixed disk), or distributed from a server or electronic bulletin board over the communication system (e.g., the Internet or World Wide Web).

Hardware logic (including programmable logic for use with a programmable logic device) implementing all or part of the functionality previously described herein may be designed using traditional manual methods, or may be designed, captured, simulated, or documented electronically using various tools, such as Computer Aided Design (CAD), a hardware description language (e.g., VHDL or AHDL), or a PLD programming language (e.g., PALASM, ABEL, or CUPL).

Programmable logic may be fixed either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), or other memory device. The programmable logic may be fixed in a signal that is transmittable to a computer using any of various communication technologies, including, but in no way limited to, analog technologies, digital technologies, optical technologies, wireless technologies (e.g., Bluetooth), networking technologies, and internetworking technologies. The programmable logic may be distributed as a removable storage medium with accompanying printed or electronic documentation (e.g., shrink wrapped software), preloaded with a computer system (e.g., on system ROM or fixed disk), or distributed from a server or electronic bulletin board over the communication system (e.g., the Internet or World Wide Web).

The present invention may be embodied in other specific forms without departing from the true scope of the invention. The described embodiments are to be considered in all respects only as illustrative and not restrictive.

What is claimed is:

1. A quadrature digital-to-analog converter comprising:
   two single-ended or differential outputs;
   a plurality of elements that can be individually allocated to either of the two outputs or, for differential outputs, their complements; and
   element selection logic operably coupled to dynamically allocate elements to the two outputs based upon a number of inputs according to a predetermined element selection scheme that substantially averages out errors in the two outputs induced by element mismatch over time, wherein the element selection logic maintains a plurality of state variables for tracking element usage, and wherein the number of state variables is less than the number of elements.

2. The quadrature digital-to-analog converter of claim 1, wherein the element selection logic comprises:
   logic for manipulating the plurality of elements as a bi-directional circular array of elements; and
   logic for allocating elements to the two outputs in opposite directions through the bi-directional circular array with reference to a common anchor point.

3. The quadrature digital-to-analog converter of claim 2, wherein the logic for allocating elements to the two outputs in opposite directions through the bi-directional circular array with reference to a common anchor point comprises:
   logic for determining a desired number of elements for each of the two outputs;
   logic for determining whether allocation of the desired number of elements to each output in opposite directions through the bi-directional circular array with reference to the common anchor point would cause contention between the two outputs;
   logic for resolving the contention, provided allocation of the desired number of elements to each output would cause contention between the two outputs; and
   logic for allocating the desired number of elements to each output.

4. The quadrature digital-to-analog converter of claim 3, wherein the logic for resolving the contention comprises:
   logic for selecting a priority output from among the two outputs;
   logic for providing a preferred allocation to the priority output;
   logic for moving the common anchor point; and
   logic for reversing the directions for allocating elements to the two outputs.

5. A method for mismatch-shaping for a quadrature digital-to-analog converter (DAC), the quadrature DAC comprising an element array for producing outputs for two DAC channels, the method comprising:

manipulating the element array as a bi-directional circular array; and allocating elements to the two DAC channels in opposite directions through the bi-directional circular array starting at a common anchor point.

6. The method of claim 5, wherein allocating elements of the bi-directional circular array to the two DAC channels in opposite directions through the bi-directional circular array starting at a common anchor point comprises:

determining a desired allocation for each of the two DAC channels.

7. The method of claim 6, wherein allocating elements of the bi-directional circular array to the two DAC channels in opposite directions through the bi-directional circular array starting at a common anchor point further comprises:

allocating a first desired number of elements to one of the two DAC channels in one direction through the bi-directional circular array starting at the common anchor point; and allocating a second desired number of elements to the other of the two DAC channels in the opposite direction through the bi-directional circular array starting at the common anchor point.

8. The method of claim 7, further comprising:

allocating additional elements to one of the two DAC channels, said additional elements allocated contiguously and in the same direction as elements previously allocated to the DAC channel.

9. The method of claim 6, wherein allocating elements of the bi-directional circular array to the two DAC channels in opposite directions through the bi-directional circular array starting at a common anchor point further comprises:

determining that the desired allocations for the two DAC channels cause contention between the two DAC channels; and resolving the contention between the two DAC channels.

10. The method of claim 9, wherein resolving the contention between the two DAC channels comprises:

selecting one of the two DAC channels as a priority channel; and providing a preferred allocation to the priority channel.

11. The method of claim 10, wherein selecting one of the two DAC channels as a priority channel comprises:

determining a number of elements allocated to each of the two DAC channels; and selecting as the priority channel the DAC channel having the larger number of elements allocated.

12. The method of claim 10, wherein providing a preferred allocation to the priority channel comprises:

allocating at least one element within the desired allocations of the two DAC channels to the priority channel.

13. The method of claim 9, wherein resolving the contention between the two DAC channels comprises:

moving the common anchor point.

14. The method of claim 13, wherein resolving the contention between the two DAC channels further comprises:

reversing the directions for allocating elements to the two DAC channels.

15. The method of claim 10, wherein providing a preferred allocation to the priority channel comprises:

determining that there is a sufficient number of unused array elements for the priority channel;

allocating the unused array elements to the priority channel;

changing the anchor point;

reversing the allocation directions for the two DAC channels; and allocating a desired number of elements to the non-priority channel.

16. The method of claim 10, wherein providing a preferred allocation to the priority channel comprises:

determining that there is an insufficient number of unused elements for the priority channel and that the priority channel will not complete a rotation through the bi-directional circular array if allocated all unused elements;

allocating all unused array elements to the priority channel;

changing the anchor point;

reversing the allocation directions for the two DAC channels;

allocating a desired number of elements to the non-priority channel; and allocating an additional number of elements to the priority channel.

17. The method of claim 10, wherein providing a preferred allocation to the priority channel comprises:

determining that there is an insufficient number of unused elements for the priority channel and that the priority channel will complete a rotation through the bi-directional circular array if allocated all unused elements;

allocating all unused array elements to the priority channel;

changing the anchor point without reversing the allocation directions for the two DAC channels;

allocating a desired number of elements to the non-priority channel; and allocating an additional number of elements to the priority channel.

18. The method of claim 10, wherein providing a preferred allocation to the priority channel comprises:

determining that there are no unused elements;

determining that at least one DAC channel will complete a rotation through the bi-directional circular array;

changing the anchor point without reversing the allocation directions for the two DAC channels; and allocating the desired number of elements to each of the two DAC channels.

19. The method of claim 5, wherein allocating elements to the two DAC channels in opposite directions through the bi-directional circular array starting at a common anchor point comprises:

maintaining an anchor pointer for indicating the anchor point; and maintaining a separate pointer for each of the two DAC channels, each pointer indicating the last of a number of contiguous array elements allocated to its respective DAC channel relative to the anchor point in a particular direction through the bi-directional circular array.

20. An apparatus comprising a storage medium having embodied therein a program for mismatch shaping using an element array, the program comprising element selection logic programmed to allocate elements of the element array to a plurality of digital-to-analog converter (DAC) channels using a plurality of state variables for tracking element usage, wherein the number of state variables is less than the number of elements in the element array.

21. The apparatus of claim 20, wherein the element selection logic is programmed to manipulate the element array as a bi-directional circular array and allocate array elements to the DAC channels in opposite directions through the bi-directional circular array with reference to a common anchor point.

* * * * *